United States Patent [19]
Bolon et al.

[11] Patent Number: 5,410,496
[45] Date of Patent: Apr. 25, 1995

[54] USING DEGREES OF FREEDOM ANALYSIS TO SOLVE TOPOLOGICAL CONSTRAINT SYSTEMS FOR CONSTRUCTION GEOMETRY IN A COMPUTER AIDED DESIGN (CAD)

[75] Inventors: Craig Bolon, Brookline; Mahesh Kanumury, Boston, both of Mass.; Walid T. Keyrouz; Glenn A. Kramer, both of Austin, Tex.; Eric A. Moore, Cambridge, Mass.; Jahir A. Pabon, Austin, Tex.

[73] Assignee: Schlumberger Technology Corp., Austin, Tex.

[21] Appl. No.: 985,479

[22] Filed: Dec. 2, 1992

Related U.S. Application Data

[63] Continuation-in-part of Ser. No. 365,576, Jun. 13, 1989, Pat. No. 5,253,189.

[51] Int. Cl.⁶ .................... G06F 15/20; G06F 15/60
[52] U.S. Cl. ............................. 364/578; 364/474.24
[58] Field of Search ................. 364/578, 474.24, 565, 364/566, 579; 395/919, 920

[56] References Cited

U.S. PATENT DOCUMENTS

| | | |
|---|---|---|
| 4,736,206 | 4/1988 | Christensen et al. . |
| 4,736,306 | 4/1988 | Christensen et al. ........... 364/474.24 |
| 4,757,461 | 7/1988 | Stohr et al. . |
| 4,791,579 | 12/1988 | Kranitzky . |
| 4,831,546 | 5/1989 | Mitsuta et al. . |
| 4,831,548 | 5/1989 | Matoba et al. . |
| 4,835,709 | 5/1989 | Tsai et al. . |

(List continued on next page.)

FOREIGN PATENT DOCUMENTS 161964  11/1985  European Pat. Off. .

OTHER PUBLICATIONS

Orlandea et al., *J. of Eng. for Industry* (1977)99:780–784.
Shigley et al., *Theory of Machines and Mechanisms*, Chapter 5, pp. 169–192, McGraw-Hill Book Company, 1980.
Erdman et al., *Mechanism Design: Analysis and Synthesis*, Chapter 8, pp. 391–478, Prentice Hall, Englewood Cliffs, NJ, 1984.
Artobolevsky, *Mechanisms in Modern Engineering Design*; originally published as *Manual of Mechanisms*, USSR Academy of Sciences, 1947–1952; translated and reprinted, MIR Publishers, Moscow, 1975.
Cagan and Agogino, "Innovative Design of Mechanical Structures from First Principles," to appear in AI EDAM, 1988.
Hall, *Kinematics and Linkage Design*, (1961) Chapter 7, pp. 111–153.
Hrones and Nelson, *Analysis of the Four–Bar Linkage*, the Technology Press of MIT and John Wiley & Sons, Inc., New York, 1951.
Kowalski, "The VLSI Design Automation Assistant: A Knowledge–Based Expert System," Thesis, Dept. of Electrical and Computer Engineering, Carnegie-Mellon University, Apr. 1984.
Mead and Conway, *Introduction to VSLI Systems*, Addison–Wesley, Reading, Mass. 1980.
Roylance, "A Simple Model of Circuit Design," MIT Artificial Intelligence Lab Memo Al–TR–703, 1983.
Turner and Bodner, "Optimization and Synthesis for
(List continued on next page.)

*Primary Examiner*—Ellis B. Ramirez
*Attorney, Agent, or Firm*—Fish & Richardson

[57] ABSTRACT

A method, useful in computer-aided design, for finding configurations of collections of geometric elements representing shapes of physical objects that satisfy a set of geometric constraints, when these constraints relate to topological properties of the geometric elements. In particular, the invention relates to a method that classifies the geometric elements in terms of degrees of freedom, categorizes topological properties in terms of biases, and synthesizes a solution by progressively reducing the total degrees of freedom in the system.

34 Claims, 8 Drawing Sheets

U.S. PATENT DOCUMENTS

| | | |
|---|---|---|
| 4,855,939 | 8/1989 | Fitzgerald, Jr. et al. . |
| 4,858,146 | 8/1989 | Shebini . |
| 4,866,663 | 9/1989 | Griffin . |
| 4,868,766 | 9/1989 | Oosterholt . |
| 4,912,657 | 3/1990 | Saxton et al. . |
| 4,928,233 | 5/1990 | Millis . |
| 4,965,740 | 10/1990 | Schofield et al. . |
| 5,043,929 | 8/1991 | Kramer et al. ............ 364/578 |
| 5,249,151 | 9/1993 | Chang et al. ............ 364/578 |
| 5,253,189 | 10/1993 | Kramer ............ 364/578 |

OTHER PUBLICATIONS

Mechanism Design," *Proc. of Autofact-88*, Detroit, Oct. 1988.

Press et al., *Numerical Recipes: The Art of Scientific Computing*, Cambridge University Press, 1986.

Sutherland, "Sketchpad: A Man-Machine Graphical Communication System," Ph.D. Thesis, MIT, Cambridge, Mass., 1963.

Borning, "ThingLab-A Constraint-Oriented Simulation Laboratory," Ph.D. Thesis, Sanford University, Stanford, Calif. Jul. 1979.

Steele, Jr., "The Definition and Implementation of A Programming Language Based on Constraints," Ph.D. Thesis, MIT, Cambridge, Mass., 1980.

Gelernter, *Computers and Thought*, Feigenbaum and Feldman, eds., pp. 134–152, McGraw Hill, New York, NY, 1963.

Johnson, "Optimal Linkage Synthesis: Design of a Constant Velocity, Straight Line Motion Scanning Mechanism," Masters Thesis, University of California, Berkeley, Calif. 1985.

Kota et al., *Mechanical Engineering* (1987) pp. 34–38.

Turner, "BravoMost:Optimal Synthesis for Mechanism Design," May 10, 1989.

Bobrow, "Qualitative Reasoning about Physical Systems: An Introduction," *Artificial Intelligence* vol. 24, Nos. 1–3, 1984, pp. 1–5.

DeKleer et al., "A Qualitative Physics Based on Confluences," *Artificial Intelligence*, Vo. 24, Nos. 1–3, 1984, pp. 7–83.

Bravo Most Advertising Brochure (1989).

Okino et al.; "Robot Simulator in TIPS/Geometric Simulator, Robotics & Computer–Integrated Manufacturing"; vol. 3, Nov. 4, pp. 429–437, 1987.

Gelsey et al.; "Automated Reasoning About Machine Geometry and Kinematics"; Proc. at the 3rd Conf. on Artificial Intelligence Applications, Feb. 1987, pp. 182–187.

Heginbotham et al., "Rapid Assessment of Industrial Robots Performance by Interactive Computer Graphics," *9th International Symposium on Industrial Robots*, Washington, D.C., Mar. 13–15, 1979, pp. 563–574.

Meyer, "An Emulation System for Programmagle Sensory Robotrs," *IBM J. Res. Develop.* (1981)25:955–961.

Levary et al., "Hybrid Expert Simulation System (HESS)," *Expert Systems* (1988)5:120–129.

Thoreson et al., "Designing Mechanisms for Production Equipment," *Machine Design* (1988)60:113–117.

Karmarkar et al., "Power Series Variants of Karmarkar–Type Algorithms," *AT&T Technical Journal* (1989)68:20–36.

```
# include common.hpp

Status   plane_point_distance_00010000(
         Constraint      *constraint,              // incoming constraint
         Bias            *biasResult )-            // bias result for constraint
{
         Point           *fixedPoint ;             // reference point
         Plane           *freePlane ;              // constrained ("free") plane
         Real            distance ;                // constraint value
         Location        fixedPointLocation ;      // reference location
         Location        freePlaneDirection ;      // direction to be constrained
         Bias            orientationBias ;         // resulting bias, standardized
         PlaneLocus      planeLocus ;              // locus equivalent to plane
         Location        nearestLocation ;         // nearest location to point
         Displacement    currentDisplacement ;     // current plane to point
         Real            projectedDistance ;       // parallel to normal
         Real            motionDistance ;          // distance to move plane
         Displacement    motionDisplacement ;      // displacement of plane fixedPoint = ( Point * ) constraint → Fixed Geom( ) ;
         freePlane = ( Plane * ) constraint → OtherGeom( stationaryGeom ) ;
         fixedPointLocation = fixedPoint → GetLocation( ) ;
         freePlaneLocation = freePlane → GetLocation( ) ;
         freePlaneDirection = freePlane → Get NormalDirection( ) ;
         distance = constraint → GetParameterValue( ) ;
         orientationBias = constraint → GetBiasRequest( ) ;

PlaneLocus = PlaneLocus( freePlaneLocation, freePlaneDirection ) ;
         nearestLocation = planeLocus.ProjectedLocation( fixedPointLocation ) ;
         current Displacement = nearest Location
             DisplacementTo( fixedPointLocation ) ;
         projectedDistance = currentDisplacement.
             DistanceProjectedAlong( freePlaneDirection ) ;

if ( orientationBias == BIAS_UNSPECIFIED )
         {      if ( POSITIVE( projectedDistance ))
                         *biasResult = orientationBias = BIAS_ABOVE ;
                else if ( NEGATIVE( projectedDistance ))
                         *biasResult = orientationBias = BIAS_BELOW ;
                else
                {       *biasResult = BIAS_UNSPECIFIED ;
                        orientationBias = BIAS_ABOVE ;
                }
         }
         else           *biasResult = orientationBias ;
         if ( orientationBias == BIAS_ABOVE)
                        motionDistance = projectedDistance - distance ;
                else    motionDistance = projectedDistance + distance ;

motionDisplacement =
            Displacement( freePlaneDirection, motionDistance ) ;
         freePlane → Translate( motionDisplacement ) ;
         freePlane → MakeGrounded( ) ;
         constraint →SetConstraintStatus( CONSTRAINT_SATISFIED ) ;
         return SUCCESS ;
```

FIG. 4

USING DEGREES OF FREEDOM ANALYSIS TO SOLVE TOPOLOGICAL CONSTRAINT SYSTEMS FOR CONSTRUCTION GEOMETRY IN A COMPUTER AIDED DESIGN (CAD)

This application is a continuation-in-part of U.S. patent application 07/365,586 filed Jun. 13, 1989.

FIELD OF THE INVENTION

The present invention relates to a method for finding configurations of collections of geometric elements representing shapes of physical objects that satisfy a set of geometric constraints, when these constraints relate to topological properties of the geometric elements. It is particularly useful for mechanical computer-aided design. In particular, the invention relates to a method that classifies the geometric elements in terms of degrees of freedom, categorizes topological properties in terms of biases, and synthesizes a solution by progressively reducing the total degrees of freedom in the system.

BACKGROUND OF THE INVENTION

It is desirable to describe mechanical parts and assemblies, when using computer-aided design systems, not merely in terms of numeric requirements like angles and dimensions, but also in terms of geometric requirements. For example, specified faces are to be parallel, circles and lines are to be tangent, or edges are to meet at a specified vertex. By combining such geometric requirements with symbolic numerical requirements, a model can be defined that will generate many different but related physical shapes, as controlled by values of the symbolic constraint parameters, and that will serve as a template for mating shapes in an assembly. The use of geometric information to specify shapes of physical objects is "construction geometry." The combination of geometric and numeric requirements is "geometric constraints."

Combining geometric requirements with numeric requirements often fails to describe shapes of physical objects completely. For example, any asymmetric object has a mirror image with exactly the same geometric elements, the same geometric relations, and the same numerical properties. The differences between an asymmetric shape and its mirror image are topological properties. One object may have a notch to the left of center, the other to the right. For many practical mechanical designs, geometric constraint systems need to be augmented using topological properties, in order to describe shapes completely. Topological properties may be identified although not specified, they may be specified explicitly, they may be specified through the topology exhibited in an approximate configuration of the geometric elements, they may be specified by reference to other geometric objects, or they may be specified in a combination of ways. A collection of geometric and numeric requirements for geometric elements augmented using topological properties is a "topological constraint system."

Sometimes, a designer may need to examine a partial solution to a topological constraint system before completing a definition for all constraints. In other circumstances, a designer may want to move or distort selected geometric elements of a topological constraint system or to explore spatial relations among them or with other geometry. A designer may also make a mistake, adding an inconsistent constraint; and the designer may want to see a solution up to the point of error, in order to correct the problem. To meet these needs, a method for solving a topological constraint system should be fast and robust.

Several methods are known for solving systems of constraints. Some methods represent constraints as equations; they may provide choices among multiple roots of equations, but they are unable to identify the topological significance of the choices. So-called "propagational" or "parametric" numerical methods may recognize topological properties but can find their progress blocked by coupled constraints that cannot be solved individually. So-called "variational" methods typically solve coupled constraints, but they are relatively slow, they encounter accuracy and stability problems, and they often fail to converge when there is a singularity in the topological constraint system. U.S. Pat. No. 5,043,929 and U.S. patent application 07/365,586 disclose certain techniques for solving constraint systems using degrees of freedom analysis that can overcome such problems, but they primarily address constraint systems for geometry of kinematic mechanisms rather than for construction geometry, and they do not explicitly recognize topological properties or means for satisfying topological requirements.

In "Reasoning about Geometric Constraints" (1989), Arbab and Wang describe "Operational Transformation Planning" (OTP), an approach to solving constraint systems based upon planning sequences of operations (e.g., rotations and translations). OTP does not recognize topological properties or topological requirements. OTP is also much less efficient than degrees of freedom analysis because it requires that a constraint be solved repeatedly as additional constraints are solved. In addition, to solve many constraint systems OTP must backtrack, i.e., throw away part of its solution and start over. Finally, the operational transformation component of OTP cannot solve constraint systems with simple cycles of constraints; instead, these cycles must be explicitly recognized and solved with numerical iteration techniques.

Aldefeld, in "Variation of geometries based on a geometric-reasoning method" (1988), describes an approach to geometric constraint satisfaction based upon constraint propagation rules. The rules used in this system are informally devised, based upon techniques of constructive geometry. An initial database of geometric entities and relationships (constraints) is created by the user. This method then applies its rules in a forward-chaining manner to derive new relationships between entities and, ultimately, values for the descriptive variables of each entity. The geometric-reasoning method does not recognize topological properties or topological requirements. With this technique, the size of the database may grow exponentially, resulting in poor performance.

In "A CAD system with declarative specification of shape" (1987), Sunde follows an approach similar to Aldefeld's but represents all derived relationships in terms of "CA-sets," which are sets of pairs of points whose relative orientation is fixed, and "CD-sets," which are sets of points where each point is a fixed distance from every other point in the set. Sunde's system has only line segments and two types of constraints: distance between endpoints, and angle between line segments. It does not recognize topological properties or topological requirements. Sunde does not explain how such an approach could be adapted to a larger variety of geometric entities and constraints.

Bruderlin, in "Constructing three-dimensional geometric objects defined by constraints" (1986), describes another rule-based method. In this approach, the database consists only of points, used to define the geometric entities. Construction rules are used in a backward-chaining manner to derive the locations of points. While this approach avoids uncontrolled growth in the size of the database, the solution of each constraint may require an arbitrarily large amount of inference. Because only fully evaluated geometry is stored in the database, the same inferences may be made repeatedly, resulting in poor performance. Bruderlin recognizes that some constraint systems have multiple solutions, which exhibit topological properties, but he does not describe how to determine or specify topological properties. Like Sunde, Bruderlin also fails to explain how his approach could be adapted to a larger variety of geometric entities and constraints.

In "PictureEditor" (1989), Kin, et al., describe an approach that can solve problems that can be created with ruler and compass constructions. PictureEditor uses a technique called "2-forest propagation," which works backwards from unknowns to knowns, solving two constraints at a time. PictureEditor recognizes multiple solutions to systems but does not distinguish them topologically, providing only methods of finding nearest positions. Degrees of freedom analysis can solve a much wider range of constraints. Unlike "2-forest propagation," it can properly identify and solve geometric singularities.

In "Programming interactions by constraints" (1989), Todd solves constraint systems by reformulating the constraints as algebraic equations and then using Groebner bases to solve the equations symbolically. Compared to degrees of freedom analysis, this method is slower. Because it deals with algebra instead of geometry, it cannot identify the geometric significance of singularities. Todd, like Owen, recognizes multiple solutions to equation systems; he describes a method to try alternate solution branches when one branch fails, but his methods do not identify the topological significance of these branches. In "Mathematica, a System for Doing Mathematics by Computer" Addison-Wesley (1986) Wolfram describes computer software that can solve sets of equations both symbolically and numerically. Although Mathematica is among the most capable equation-solving programs available, it is unable to provide symbolic solutions or stable numerical solutions for some geometric constraint systems of only moderate complexity.

Both Wolfram, in "Mathematica, a System for Doing Mathematics by Computer" and B. Stroustrup, in "The C++ Programming Language" (1986) describe languages appropriate for expressing algorithms usable with the present invention and executing them on a digital computer.

Related Applications

U.S. Pat. No. 5,043,929 and U.S. patent application 07/365,586 introduced a concept of making categorical decisions about geometric entities and constraints using a "degrees of freedom" analysis approach; they concern primarily constraint systems for geometry of kinematic mechanisms rather than for construction geometry, and they do not explicitly recognize topological properties or means for satisfying topological requirements. U.S. patent application Ser. No. 07/675,592 describes a method of solving the geometric constraint satisfaction problem using graph based solution techniques. U.S. Patent Application entitled "Method for Solving Geometric Constraint Systems" filed Nov. 20, 1992 describes a method for finding possible configurations of a geometric constraint system using degrees of freedom analysis. The present invention reflects a refinement and extension of these approaches, introducing techniques to identify topological properties in geometric constraint systems for construction geometry and to solve geometric constraint systems for construction geometry that include topological requirements.

The nonpatent references cited herein are incorporated by reference for background and the patent references cited herein are incorporated by reference for all purposes.

SUMMARY OF THE INVENTION

The present invention consists of a method for solving topological constraint systems. It is particularly useful for mechanical computer-aided design. In particular, the invention relates to a method that classifies geometric elements in terms of degrees of freedom, categorizes topological properties in terms of biases, and synthesizes a solution by progressively reducing the total degrees of freedom in a topological constraint system.

Rather than construct a set of equations to represent a topological constraint system and solve such a set of equations by either symbolic or iterative methods, the method of this invention makes categorical decisions about a topological constraint system, using degrees of freedom, and adjusts numerical parameters based on these decisions. An objective of this method is to solve topological constraint systems. A further objective of this method is to provide faster solutions to topological constraint systems, as compared to other methods for solving them. Further objectives of this method are to provide greater tolerance for illconditioned topological constraint systems and greater numerical stability, as compared to other methods, and to accommodate singularities and passive constraints. Still further objectives of this method are to accommodate underconstraints and overconstraints without loss of speed or accuracy and to identify causes of underconstraints and overconstraints.

Generally speaking, the method of this invention categorizes the geometric elements of a topological constraint system in terms of degrees of freedom, categorizes topological properties in terms of biases, synthesizes a sequence of solution algorithms based on geometric categories, topological properties, and numerical measurements by progressively reducing the total degrees of freedom, and determines allowed configurations of the geometric elements, applying solution algorithms in the sequence that was synthesized. During the process of synthesizing such a sequence of solution algorithms, a topological constraint system is solved. Repeated application of the sequence of solution algorithms can be used to obtain additional solutions in an efficient and numerically robust manner for changes in constraint parameters.

In a preferred form, the present method accepts specifications for topological properties. In another preferred form, the present method provides maintenance of topological properties for all or selected geometric elements. In yet another preferred form, the present method interprets geometric constraint relations as nondirectional. In still another preferred form, the present method subcategorizes degrees of freedom in terms of invariants and signatures, which describe how degrees of freedom can be expressed.

BRIEF DESCRIPTION OF THE DRAWINGS

FIG. 4 presents an algorithm, written in the C++ language, for an action solver.

DESCRIPTION OF PREFERRED EMBODIMENTS

Figure 1:
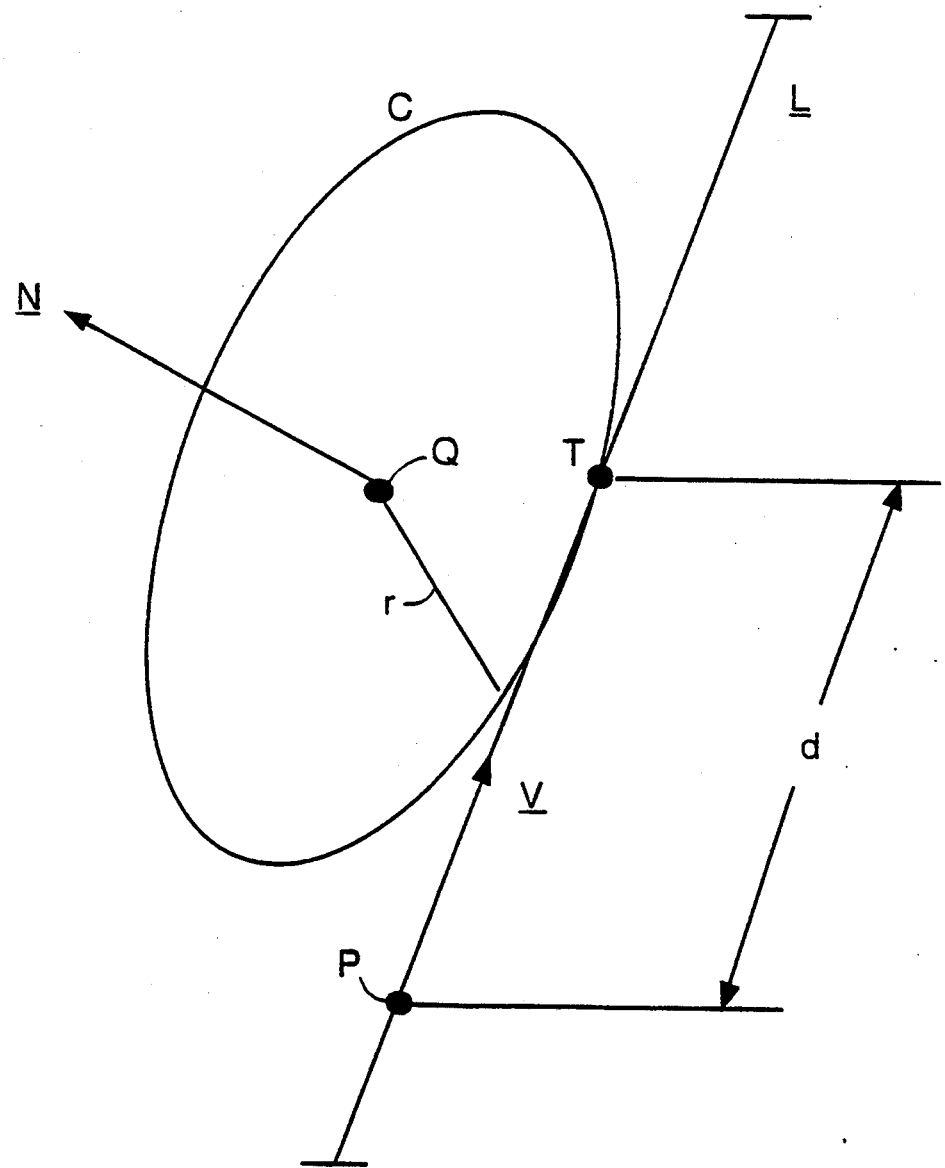
FIG. 1 schematically depicts a tangency constraint between a line and a circle in 3-space.

1. Overview
2. Terminology
3. Degrees of Freedom Analysis as Applied to Topological Constraint Systems for Construction Geometry
4. Characterization of Topological Constraint Systems
5. Solution Synthesis and Solution Strategy
6. Rigid Bodies and Special Techniques
7. Advantages of Degrees of Freedom Analysis in Solving Topological Constraint Systems for Construction Geometry

1 Overview

Degrees of freedom analysis solves a topological constraint system by constructing a solution plan, based on categorical decisions about properties and attributes of geometric elements, rather than by manipulating equations, by solving equations iteratively, or by seeking in some other form a purely numerical solution. Objectives of this approach are to provide faster solutions, greater numerical tolerance and stability, accommodation of underconstraint and overconstraint without loss of speed or accuracy, and identification of causes of underconstraint and overconstraint. Degrees of freedom analysis for topological constraint systems is a method that may be used in conjunction with mechanical calculation. However, it is of greatest benefit when implemented as a logical and numeric process in a digital computer.

Degrees of freedom analysis considers two general types of attributes of a topological constraint system: categorical attributes and numerical attributes. Using degrees of freedom and other categorical attributes, it plans a sequence of steps to guide solution of the system. In the process of constructing such a solution plan, such a topological constraint system is solved. This approach finds efficient, closed form algorithms when they exist; otherwise it allows formulation of iterative algorithms with a minimal number of iteration parameters.

2 Terminology

A "geometric element" (sometimes referred to as "geometric entities" or "geoms") is a collection of points in a one-dimensional or multidimensional space that are associated by quantitative relations. It can be, for example, a point, line, line segment, circle, plane or sphere. A quantitative relation that will define a sphere in 3-space, as an example, is all points at a specified distance from a specified center point.

A set of geometric elements representing shapes of one or more physical objects is called "construction geometry."

A set of geometric elements representing movable parts of one or more mechanisms is called "kinematic geometry."

A "composite geometric element" is a geometric element that includes points and vectors, representing locations and directions in the space of geometric elements.

The "native variables" of a geometric element are the conventional translational and rotational variables representing displacements in the space in which it is defined. In 2-space, for example, the native variables represent translations parallel to the 2-space axes and rotation in the plane of the axes.

The "descriptive parameters" (sometimes referred to as "configuration variables") for a geometric element are the quantities used to describe it. For example, a line in 2-space may be described by the coordinates of one point on the line and the coordinates of a direction vector, that is, of a point on a unit circle about the origin of a parallel line segment from the origin. Such a line may also be described by slope and minimum distance from the origin.

A "geometric constraint" is a numerical or categorical property required of a geometric element or a numerical or categorical relationship required between two or more geometric elements. For example, in 2-space a line segment might be required to be of unit length; in 3-space four spheres of equal radius might all be required to be externally tangent to one another. This definition of geometric constraints does not make a distinction among purely geometric constraints, such as tangency, purely numeric constraints, such as dimension values, and constraints that are a mixture of these types.

A "rigid body" is a composite geometric element explicitly assembled from other geometric elements, potentially including other rigid bodies, when, as a result of the application of geometric constraints, such geometric elements all have fixed dimensions and fixed positions and orientations with respect to one another but when as an aggregate they may retain some freedom for translation, rotation or a combined motion.

A geometric element that is pan of a composite geometric element is called a "component" of the composite geometric element. A geometric element that is pan of a rigid body is called a "component" of the rigid body.

Combining geometric elements into rigid bodies and adding geometric elements to rigid bodies as components is called "rigid body accretion."

A "locus" is also a collection of points in a one-dimensional or multi-dimensional space that are associated by quantitative relations. It can be, for example, a point, line, circle, plane or sphere. A locus differs from a geometric element in that it is used to express restrictions imposed by geometric constraints on geometric elements or on components of composite geometric elements.

A geometric constraint that is a property required of a single geometric element is a "unary constraint." For example, requiting a line segment to have a numerically specified length is a unary constraint.

A geometric constraint that is a relationship required among more than one geometric elements is a "plural constraint." For example, requiting a line to be parallel to a plane is a plural constraint; since it involves two geometric elements, it can be called a binary constraint.

The "constraint parameters" of a geometric constraint designate required or bounding values of a property or relationship. For example, points may be required to be separated by a specified distance, or circle radii may be required to differ by no more than a specified amount.

The "minimal parameters" for a geometric element subject to possible geometric constraints is the smallest possible set of parameters that can be used to specify all possible configurations of the element, satisfying any applicable geometric constraints. For example, minimal parameters for an infinite line in 2-space required to pass a specified distance from the origin can consist of a positive-definite distance from the origin and an angle in the range (-Pi, Pi) with respect to on of the axes.

The "degrees of freedom" for a geometric element is the count of its minimal parameters. For example, an infinite line in 2-space required to pass a specified distance from the origin has one degree of freedom, because any such line can be specified by one parameter, an angle with respect to an axis.

The "generalized coordinates" for a geometric element subject to geometric constraints are a set of descriptive parameters, which may be governed by coupling relations or bounding relations, such that all configurations of the geometric element that satisfy its geometric constraints are specified by sets of values for the generalized coordinates satisfying any coupling or bounding relations, and such that any set of values for the generalized coordinates satisfying any coupling or bounding relations specifies a configuration of the geometric element that satisfies its geometric constraints.

A "topological property" is a qualitative characteristic of geometric elements that does not change with gradual motions and deformations. Many topological properties involve a sense of direction. For example, in 2-space the center point of a circle made tangent to a directed line may lie either to the left or the fight of the line; in 3-space the directions of the normals to two planes may be either correlated or anticorrelated.

A "bias" is a categorical selection for a topological property which differentiates configurations of geometric elements that satisfy numeric or geometric requirements. For example, a point in 2-space required to be at a specified distance from the circumference of a reference circle (less than its radius) might be either inside or outside the reference circle. Two families of configurations satisfy such a geometric relationship: points with "inside bias," on a circle inside the reference circle, and points with "outside bias," on a circle outside the reference circle.

A bias becomes "indeterminate" when the numeric or geometric requirement to which it applies provides only a single family of configurations. For example, inside/outside bias for a point in 2-space required to be at a specified distance from the circumference of a reference circle (less than the radius) becomes indeterminate when the distance is zero. Only a single family of configurations satisfies such a geometric requirement: points on the reference circle.

A "geometric constraint system" is a set of geometric elements governed by a set of geometric constraints. For example, faces of a rectangular box in 3-space constitute a set of rectangles connected through a set of dimension, position, and orientation constraints.

A "topological constraint" is a geometric constraint involving a topological property, to which has been added a requirement that its solution exhibit a specified bias.

A "topological constraint system" is a geometric constraint system that recognizes topological properties, includes topological constraints, or both.

A geometric constraint is "solved" when the descriptive parameters of the geometric elements to which it applies have been adjusted to provide the required property or to satisfy the required relationship without violating any other previously considered constraint. A topological constraint is "solved" when the geometric constraint on which it is based has been solved and its topological requirements have been satisfied. A topological constraint system is "solved" when all of its geometric and topological constraints have been solved and its topological properties have been categorized.

The "total degrees of freedom" for a topological constraint system is the sum of the degrees of freedom for its geometric elements.

If satisfaction of all geometric and topological constraints in a topological constraint system would not reduce the total degrees of freedom to zero, the topological constraint system is said to be "unconstrained."

If there exist one or more geometric or topological constraints whose removal from a topological constraint system would not change the total degrees of freedom that can be consumed by satisfying geometric constraints, the topological constraint system is said to be "overconstrained."

A topological constraint system that is neither underconstrained nor overconstrained is said to be "fully constrained."

A topological constraint system that both underconstrained and overconstrained is said to be "spuriously constrained."

Geometric and topological constraints remaining in an overconstrained topological constraint system after reducing the total degrees of freedom to zero, and geometric constraints whose removal from the topological constraint system would not change the total degrees of freedom that can be consumed by satisfying geometric constraints, are called "redundant constraints."

The "configuration" of a geometric element is a set of values for its descriptive parameters that specifies a particular shape and spatial orientation. The "configuration" of a topological constraint system is a set of values for the descriptive parameters of all its geometric elements that specifies their shapes and spatial orientations.

An "invariant" is an attribute of a constrained geometric element that describes ways in which some degree or degrees of freedom that it retains can be expressed. For example, in 3-space a point constrained to be at a nonzero distance from another point can be said to have a two dimensional locus invariant for its position, namely, a sphere about the reference point whose radius is equal to the required distance.

A geometric constraint has a "singularity," as applied to a geometric element, when isolated values of its constraint parameters alter the resulting degrees of freedom, invariants or biases from what would otherwise be obtained with small changes in those constraint parameters. For example, constraining the distance to a specified point, as applied to an otherwise unconstrained point in 3-space, normally leaves two degrees of freedom; but if the distance is specified to be zero it leaves no degrees of freedom.

A geometric constraint is "passive," as applied to a geometric element, when it is automatically satisfied by all the configurations of the geometric element that are allowed by previously solved geometric constraints.

A geometric constraint is "inconsistent," as applied to a geometric element, when it cannot be satisfied by any configuration of the geometric element that is allowed by previously solved geometric constraints.

Redundant constraints may or may not be passive. If all redundant constraints are passive, a topological constraint system is said to be "overconstrained but consistent."

A property of a geometric element is "grounded" when small changes to it are not allowed by previously solved geometric constraints. A geometric element is "grounded" when all its properties are grounded and when previously solved geometric constraints do not allow small changes or combinations of small changes in its descriptive parameters. A topological constraint system is "grounded" when all its geometric elements are grounded.

The "signature" for a geometric element with a particular number of degrees of freedom is a pattern of integer values based on its invariants that further categorizes the ways in which its degrees of freedom can be expressed.

A "constraint solver" (an extension of the previous term "plan fragment") is an algorithm that satisfies all or part of the requirements of one or more geometric constraints or that contributes to such satisfaction of requirements, based on the degrees of freedom and descriptive parameters of the geometric elements to which they have been applied, and, when invariants are being used, also based on signatures and invariants of such geometric elements.

A "first-order constraint solver" is a constraint solver for a single geometric constraint which utilizes only information pertaining to geometric elements involved in that geometric constraint.

A "higher-order constraint solver" is a constraint solver for more than one geometric constraint or a constraint solver which utilizes information pertaining to geometric elements other than those involved in a single geometric constraint.

An "action solver" is a first-order constraint solver for a geometric constraint of some particular type, involving particular types of geometric elements with particular degrees of freedom and, if invariants are used, with particular signatures.

An action solver for a plural constraint can be applied when all but one of the geometric elements involved in that plural constraint are "fixed enough" to serve as references for the remaining geometric element, that is, when their properties relevant to the geometric constraint have been grounded. For example, the action solver for a geometric constraint that specifies an angle between two planes can be applied when the direction of one plane has been grounded, regardless of whether any positions on either plane have been determined.

A geometric element involved in a unary constraint is the "object" of a constraint solver for that unary constraint. The "object" of an action solver for a plural constraint is the geometric element remaining after determination that other geometric elements that are fixed enough to serve as references.

A "locus intersection solver" is a first-order or higher-order constraint solver that solves coincidence constraints between two or more geometric elements, when these elements have all been constrained to lie on loci, by determining the intersection of the loci and confining the geometric elements to that intersection.

An "information sharing solver" is a higher-order constraint solver that solves constraints or contributes to the solution of a geometric constraint by sharing information associated with or produced by one or more other geometric constraints.

An "accretion solver" is an information sharing solver that performs rigid body accretion.

A "locus propagation solver" is an information sharing solver that contributes to the locus intersection solution of a geometric constraint by associating loci with one or more geometric elements or with one or more components of one or more composite geometric elements, based on previously solved geometric constraints that involve such geometric elements, such composite geometric elements, or such components of composite geometric elements.

A topological constraint system that can be combined into a single rigid body but is not fully constrained is called a "floating system."

Constraint solvers that ground properties of a floating system in order to make it fully constrained are called "grounding solvers."

Locations and directions grounded by grounding solvers in order to make a floating system fully constrained are called "anchor constraints."

The procedure of assigning potentially arbitrary values to one or more descriptive parameters for geometric elements, or potentially arbitrary invariants to geometric elements, or both, in order to satisfy a geometric constraint, is called "defaulting."

A "defaulting solver" is a constraint solver that performs defaulting.

An "iterative solution" is a solution to a geometric constraint or a topological constraint system that is obtained by systematically making changes to the values of one or more descriptive parameters of one or more geometric elements until one or more geometric constraints is satisfied.

A "local iteration" is the process of obtaining an iterative solution for one geometric constraint or a set of related geometric constraints, but not for an entire topological constraint system.

A "global iteration" is the process of obtaining an iterative solution for an entire topological constraint system.

An "iterative solver" is a constraint solver that obtains solutions either by local iteration or by global iteration.

A "solution plan" (an extension of the previous term "assembly procedure" ) for a topological constraint system is a sequence for applying constraint solvers to its geometric elements so as to satisfy its geometric and topological constraints.

The process of constructing a solution plan that solves a particular topological constraint system is called "solution synthesis."

A "solution strategy" is an algorithm that examines a topological constraint system to determine the applicability of constraint solvers during solution synthesis and chooses the order in which to apply them.

The process of designing solution strategy and constraint solvers to perform solution synthesis, when using degrees of freedom analysis to solve topological constraint systems for construction geometry, is called "application design."

3 Degrees of Freedom Analysis as Applied to Topological Constraint Systems for Construction Geometry Degrees of freedom analysis as applied to topological constraint systems for construction geometry combines inferences based on graphical relationships with accurate, robust numerical calculations. Degrees of freedom analysis categorizes the state of a topological constraint system according to the degrees of freedom for each of its geometric elements. Degrees of freedom for a geometric element provide an integer-valued measurement of how much flexibility for motion or distortion the geometric element retains. Degrees of freedom analysis for topological constraint systems also categorizes topological properties in terms of biases.

With degrees of freedom analysis, solution of a topological constraint system proceeds by progressive reduction of total degrees of freedom, guided by solution strategy that at each step selects geometric constraints or combinations of geometric constraints for solution and applies constraint solvers that utilize geometric categories, topological properties and numerical measurements to determine allowed configurations of the geometric elements, continuing until all the constraints have either been satisfied or been found to be unsatisfiable -the process of solution synthesis. During solution synthesis, a topological constraint system is solved. The steps in such a process, recorded as they are found, constitute a compact, well-ordered algorithm—a solution plan—which can be executed again to find additional solutions for changes in constraint parameters.

Degrees of freedom values generate equivalence classes for states of geometric elements, without specifying how the geometric constraints leading to a state are satisfied. These classes can be further qualified by invariants, which describe categorically how the degrees of freedom retained by a geometric element can be expressed. Degrees of freedom may be viewed as resources which are consumed when moving geometric elements and accumulating invariants on them to satisfy geometric constraints. Each step in a solution plan preserves the properties and relations established by previously satisfied geometric constraints, as these are encapsulated in remaining degrees of freedom and, potentially, in a signature of invariants. This avoidance of backtracking is an important feature of degrees of freedom analysis and contributes to its efficient performance.

By way of comparison, sets of equations that can be constructed to represent topological constraint systems are typically complex, nonlinear and tightly coupled. Domains of their variables are continuous, producing multiply infinite search spaces. For the same topological constraint systems, degrees of freedom and related categorical attributes for geometric elements will provide compact, discrete valued descriptions of the states of the topological constraint systems.

The logic simplification provided by degrees of freedom analysis, as compared to methods based on equations, can be illustrated by examining a set of constraint equations, as expressed in "Mathematica" notation (S. Wolfram, 1991), describing a tangency constraint in 3-space between circle C and line L, as shown in FIG. 1, where circle C has center point Q with coordinates (xq,yq,zq), radius r, and normal direction N with unit vector (xn,yn,zn), where point P with coordinates (xp,yp,zp) represents the closest point to the origin on line L and line L has direction V with unit vector (xv,yv,zv), and where the point of tangency T with coordinates (xt,yt,zt) is at distance d from point P on line L:

xn^2+yn^2+zn^2==1
xv^2+yv^2+zv^2==1
xp xv+yp yv+zp zv==0
xn xv+yn yv+zn zv==0
xt==xp+d xv
yt==yp+d yv
zt==zp+d zv
xn(xt−xq)+yn(yt−yq)+zn(zt−zq)==0
xv(xt−xq)+yv(yt−yq)+zv(zt−zq)==0
(xt−xq)^2+(yt−yq^2+(zt−zq)^2==r^2

Eliminating xt, yt, zt and d from the last six equations leaves six equations linking the other parameters.

The line in the foregoing example can be considered to have a directional bias with respect to the circle, counterclockwise for positive rotation in the right-hand sense with respect to the circle center, otherwise clockwise. The bias can be measured or constrained using the scalar triple product of the line's direction vector, the circle's normal vector, and a normalized vector from circle center Q to the point of tangency T, as shown in FIG. 1. In terms of the variables previously discussed, requiring counterclockwise bias can be expressed by the inequality:

xn(yt zv−yv zt)+yn(zt xv−zv xt)+zn(xt yv−xv yt)>0

This inequality can be reduced to descriptive parameters by substituting xt, yt, zt and d, as determined from the previous set of equations.

The foregoing equations reflect an unconstrained circle in 3-space having six degrees of freedom, an unconstrained line in 3-space having four degrees of freedom, and the circle-line tangency constraint removing three degrees of freedom between them. For even this relatively simple geometric constraint, one finds coupled quadratics and ratios involving the descriptive parameters. Such equations must be combined with equations representing other geometric constraints in order to solve a topological constraint system. The result is typically a complex, nonlinear, tightly coupled set of equations.

By contrast, the same geometric constraint, encountered in degrees of freedom analysis for line L to be moved with respect to circle C, is solved by rotating line direction V so that it becomes orthogonal to circle normal N, translating line L into the plane of the circle C, and translating line L toward or away from point Q in this plane to distance r from Q. The point of tangency between line L and circle C is left free to rotate around the circle; line L has one remaining degree of freedom. The complexities of the equation system have been replaced by straightforward rotations, translations and invariants.

The main objective of degrees of freedom analysis, as applied to a topological constraint system, is to construct a solution plan. In the process of constructing a solution plan, a topological constraint system is solved. With changes in constraint parameters, it can be solved again by executing the solution plan. Degrees of freedom analysis provides efficient methods for constructing a solution plan and finding an initial solution. A solution plan provides an efficient algorithm to find additional solutions with changes in constraint parameters.

4 Characterization of Topological Constraint Systems

To use degrees of freedom analysis in solving a topological constraint system, the topological constraint system must be characterized in terms of categories of geometric elements and categories of geometric constraints. The geometric relationships utilized in geometric constraints must be examined for topological properties, and such topological properties must be categorized in terms of biases. Selection of such categories is a major strategic step in application design.

Figure 2:
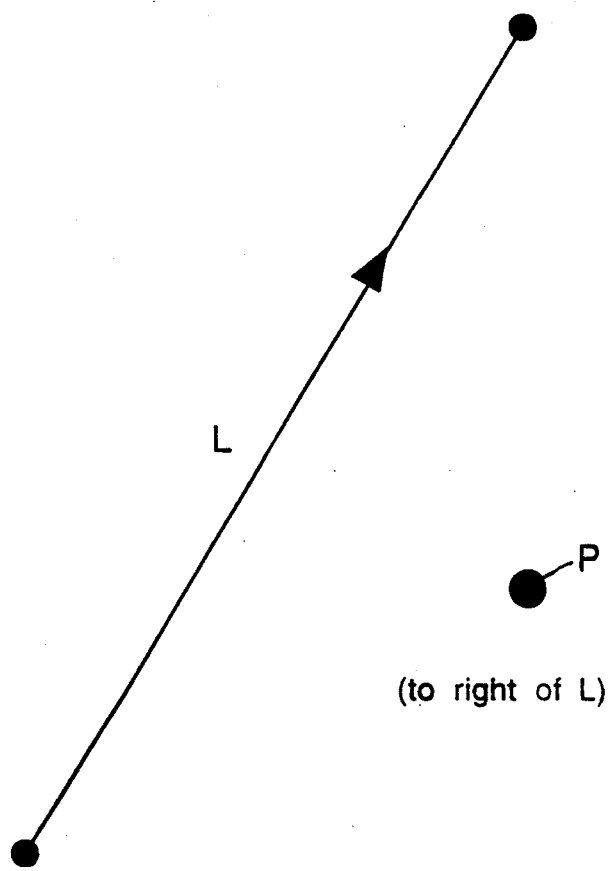
FIG. 2 illustrates a bias for characterizing a topological property of a point-line distance constraint in 2-space.

For example, solution synthesis might be designed to solve topological constraint systems in 2-space with points and line segments, governed by constraints of point-point distance, point-line distance, line-line angle, and line segment length. FIG. 2 shows a bias that might be chosen to categorize one of the topological properties exhibited by these geometric constraints. As shown, line segments are represented with vectorial directions. Point P has a bias either right or left with respect to line segment L. Such a bias can be measured by the sign of an angle (Pi/2 or −Pi/2) rotating the direction of line segment L to the direction of a vector from point P to the closest point on the infinite line that passes through line segment L. The sign of the angle is positive for right bias and negative for left bias. If point P lies on the infinite line that passes through line segment L, such a vector becomes zero length, and left/right bias becomes indeterminate. When degrees of freedom analysis is implemented in a digital computer to solve topological constraint systems for construction geometry, quantities such as vector length are usually calculated to finite precision, and comparison of the absolute value of a quantity against a threshold value should be used to decide whether a quantity has become zero.

Such categories of geometric elements, geometric constraints, and biases specify the capabilities of solution synthesis and influence the solution strategy and constraint solver algorithms that it will employ. It is desirable that geometric constraints be interpreted as nondirectional. If line-point distance is a constraint category, solution synthesis should be able to accommodate a constrained distance either between a line to be adjusted and a reference point or between a point to be adjusted and a reference line. Directional constraints, which provide only one such interpretation, substantially reduce the flexibility of solution synthesis and may prevent a solution from being found.

After categories of geometric elements and geometric constraints have been chosen, the degrees of freedom for states of the geometric elements must be determined. This is done by finding minimal parameters for each geometric element, subject to any pattern of constraints that may be applied to it. The degrees of freedom for states of geometric elements can be used to select the first-order constraint solvers required to solve constraints, eliminating searching for applicable constraint solvers.

Following determination of degrees of freedom for states of geometric elements, an optional step which is often beneficial is to define invariants that will be used to designate subcategories of states organized by degrees of freedom. In general, use of invariants tends to increase the number of constraint solver algorithms that will be used in solution synthesis but to decrease the complexity of the individual algorithms. For systems with several categories of geometric elements and geometric constraints, it is usually preferable to define subcategories for degrees of freedom states of the geometric elements, using invariants.

Invariants categorize ways in which some degree or degrees of freedom can be expressed for a geometric element. When invariants are employed, it is desirable that each of the possible states of geometric elements associated with a pattern of these invariants be characterized in terms of a discrete-valued signature, for example, specifying counts of invariants of different kinds that it includes. Such signatures can be used to select the action solvers used to solve many constraints, eliminating searching for applicable constraint solvers. The definition of such invariants and the selection of a set of such signatures is another major strategic step in application design using degrees of freedom analysis.

For example, solution synthesis might be designed to solve topological constraint systems in 3-space with geometric elements limited to points and planes, governed by geometric constraints of point-point distance, point-plane distance, plane-plane angle, and plane-(parallel)plane distance. For such a selection, application design might use the invariants fixed point, point on one-dimensional (1D) locus, point on two-dimensional (2D) locus, fixed direction, angle to fixed direction, and fixed distance point. For signatures, it might use Q1 Q2 Q3 Q4 Q5 Q6 as a format, where the individual signature components (Qn) would be integers counting the number of invariants of each of these types, with meanings as shown in Table 1.

TABLE 1

| Example of a signature format. |
|---|
| Q1 number of fixed points |
| Q2 number of points on 1D loci |
| Q3 number of points on 2D loci |
| Q4 number of fixed directions |
| Q5 number of angles to fixed directions |
| Q6 number of fixed distance points |

For the foregoing categories of geometric elements, geometric constraints and invariants, solution synthesis might use the sets of signatures shown in Table 2, with degrees of freedom shown as "-DOF" preceded by an integer.

TABLE 2

| Example of a signature set. |
|---|
| point |
| 3-DOF 000000 unconstrained |
| 2-DOF 001000 on sphere or plane |
| 1-DOF 010000 on circle or line |
| 0-DOF 100000 grounded |
| plane |
| 3-DOF 000000 unconstrained |
| 2-DOF 000001 at distance from point |
| 2-DOF 000010 at angle to direction |
| 1-DOF 000011 at point distance and direction angle 1-DOF 000100 |

TABLE 2-continued

Example of a signature set.

at specified normal direction 0-DOF 100100 grounded

In the foregoing example, the 2-DOF and 1-DOF states for planes have each been further categorized by two different signatures. There are two categories of geometric elements, eight states categorized only by degrees of freedom, and ten states categorized by combining of degrees of freedom with signatures.

In the foregoing example, assuming that all geometric constraints are to be interpreted as nondirectional, solution synthesis would need constraint solvers for point-point distance and point-plane distance, as applied to points with any point signature, and would also need constraint solvers for point-plane distance, plane-plane angle, and plane(parallel)plane distance, as applied to planes with any plane signature a total of 26 constraint solvers.

A set of signatures for a category of geometric element must be closed. Solution of any constraint applicable to a geometric element must result in new invariants that are characterized by some signature in its signature set. Support for a category of constraints applied to a category of geometric elements that uses invariants should be complete, in that all such constraints should be supported by action solvers for each possible signature of such geometric elements. Incomplete support substantially reduces the flexibility of solution synthesis and may prevent a solution from being found.

Constraint solvers must identify choices among possible solution biases, and solution synthesis should record biases that are chosen in a solution. Topological constraints will specify bias requirements that pertain to geometric constraints. In some circumstances, biases may become indeterminate. Biases might or might not be specified as mandatory; if not so specified, a constraint solver should choose a bias that agrees with an explicit bias specification, when possible, but it may otherwise choose a different bias.

Biases may not apply to all constraints, and some or all biases for some or all constraints might be left unspecified. In such circumstances, a constraint solver should choose a solution that requires the least adjustment of geometric elements. The intent of this approach is to minimize changes from an initial configuration of the geometric elements in a topological constraint system to the configuration in a solution. During interactive specification of construction geometry, when a topological constraint system is likely to be underconstrained, it is highly desirable that constraint solutions avoid changing properties of geometric elements that do not need to be changed in order to provide solutions. Such superfluous changes may interfere with the process of specifying the geometric constraints. Also, with construction geometry, initial configurations often exhibit topological properties expected in solutions; and solutions are often expected to retain them.

During interactive specification of con-struction geometry, when a topological constraint system is likely to be underconstrained, it is highly desirable that constraint solutions avoid changing properties of geometric elements that do not need to be changed in order to provide solutions. Such superfluous changes may interfere with the process of specifying the geometric constraints. With construction geometry, initial configurations often exhibit topological properties expected in solutions; and solutions are often expected to retain them.

In addition to recognizing biases, constraint solvers may be constructed to measure and maintain existing biases. Bias maintenance may be either with reference to biases present in geometry at each step of solution synthesis or with respect to biases present in an initial configuration of geometry. The availability of bias maintenance is generally desirable. It preserves topological properties of geometry while bringing quantitative properties into conformance with geometric constraints. It is also desirable that bias maintenance be individually designatible for each constraint. The pattern of such designations can establish regions of shape preservation and regions of shape distortion, to support dynamic reconfiguration of geometry.

It is usually preferable to employ native variables of a geometric element as its descriptive parameters. This retains a graphical sense of description and can help in designing efficient algorithms. However, once constraints are applied, native variables often do not comprise minimal parameters and cannot be used to determine degrees of freedom. Consider a fixed length line segment in 2-space constrained to have its endpoints lie on two fixed radius circles, leaving one degree of freedom. For most cases of this example, a single generalized coordinate measuring displacement of one endpoint around one circle can be defined as a minimal parameter, with one or more allowed regions. In a singular case, where such a circle passes through the center of the other circle and the line segment length is equal to the other circle radius, such a definition is inadequate. In general, however, definition of minimal parameters is needed only to determine degrees of freedom; and native variables, as limited by invariants, can be used to characterize geometric elements during analysis.

5 Solution Synthesis and Solution Strategy

Solution synthesis when using degrees of freedom analysis to solve topological constraint systems for construction geometry consists of categorizing states of its geometric elements according to their degrees of freedom and, potentially, according to their invariants and signatures, categorizing topological properties in terms of biases, and determining a solution in a repeated cycle of steps that progressively reduces total degrees of freedom, guided by solution strategy that at each step selects geometric constraints or combinations of geometric constraints for solution and applies constraint solvers that utilize geometric categories, topological properties and numerical measurements to determine allowed configurations of the geometric elements, continuing until all the constraints have either been satisfied or been found to be unsatisfiable, each such step consisting of the following procedures:

1. Identification of geometric constraints that are eligible to be solved, under the guidance of solution strategy.
2. Invocation of constraint solvers to solve the eligible geometric constraints.
3. Recording of the constraint solvers invoked and of their results, including new states of geometric elements and new values for their descriptive parameters.

Figure 3:
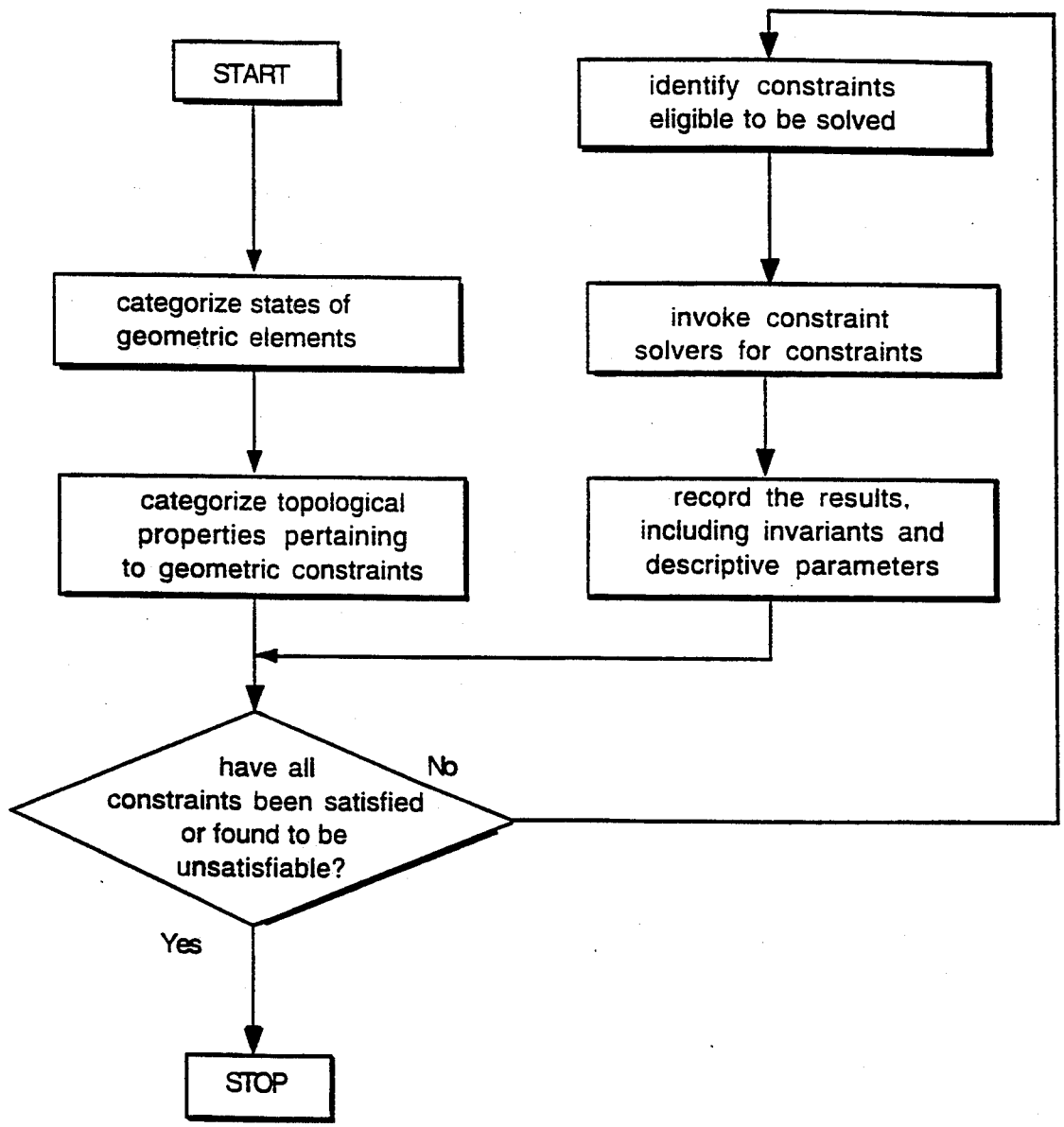
FIG. 3 schematically depicts solution synthesis using a flow chart.

Solution synthesis, as described above, is schematically depicted by the flow chart shown in FIG. 3. The step labelled "identify constraints eligible to be solved," or step (1) above, represents solution strategy.

When using degrees of freedom analysis to solve topological constraint systems for construction geometry, action solvers must always be provided and should be used preferentially, when constraints are eligible to be solved by them. An action solver must determine the solvability of its geometric constraint and, when it can be solved, must identify the biases that result, specify remaining degrees of freedom for the geometric elements, and adjust descriptive parameters for the geometric elements so as to make them conform with the geometric constraint being solved as well as with all previously solved geometric constraints involving them. When invariants are being used, an action solver must also record any changes in invariants for geometric elements. When signatures are being used, an action solver must also record changes in signatures for geometric elements.

FIG. 4 presents an algorithm written in the C++ language to provide an action solver implemented on a digital computer. This action solver is for a plane in 3-space to be moved to a specified distance from a grounded reference point. The normal direction of the plane has already been grounded. The solver expects a positive or zero constraint parameter and a bias specification for the constraint of BIASABOVE, BIASBELOW, or BIASUNSPECIFIED. For the bias specification BIASABOVE, the plane is to be positioned so that the reference point lies on the side of the plane toward which its normal direction points. The bias specification BIASBELOW means the opposite. Otherwise, the plane is to be moved the least distance necessary to satisfy the distance constraint.

In the example of FIG. 4, the solver makes a locus equivalent to the current plane and finds, by projection, the location on it that is closest to the location of the reference point. It then finds the current signed distance from the plane to the reference point, by projecting the displacement between these locations onto the plane's normal direction. If the bias request is BIASUNSPECIFIED, the solver determines, using toleranced comparison macros POSITIVE and NEGATIVE, on which side of the plane the reference point is currently located, and it assigns an internal bias value (orientationBias) based on the result. If the toleranced distance comparisons both fail, the reference point is considered to lie on the plane. The bias that will result from the constraint is also returned.

In the example of FIG. 4, the solver next computes the signed distance (motionDistance) that the plane must be moved, with respect to its normal direction, to satisfy the constraint, including its bias specification. The plane is translated this distance. Because this constraint reduces the plane's degrees of freedom from one to zero, the plane is then grounded. Status is set indicating that the constraint has been satisfied, and the solver exits. This example shows how a geometric constraint that includes a numeric requirement and a topological requirement is satisfied. For this relatively simple constraint, any combination of constraint requirements can be satisfied. No exceptions need be diagnosed.

Figure 5:
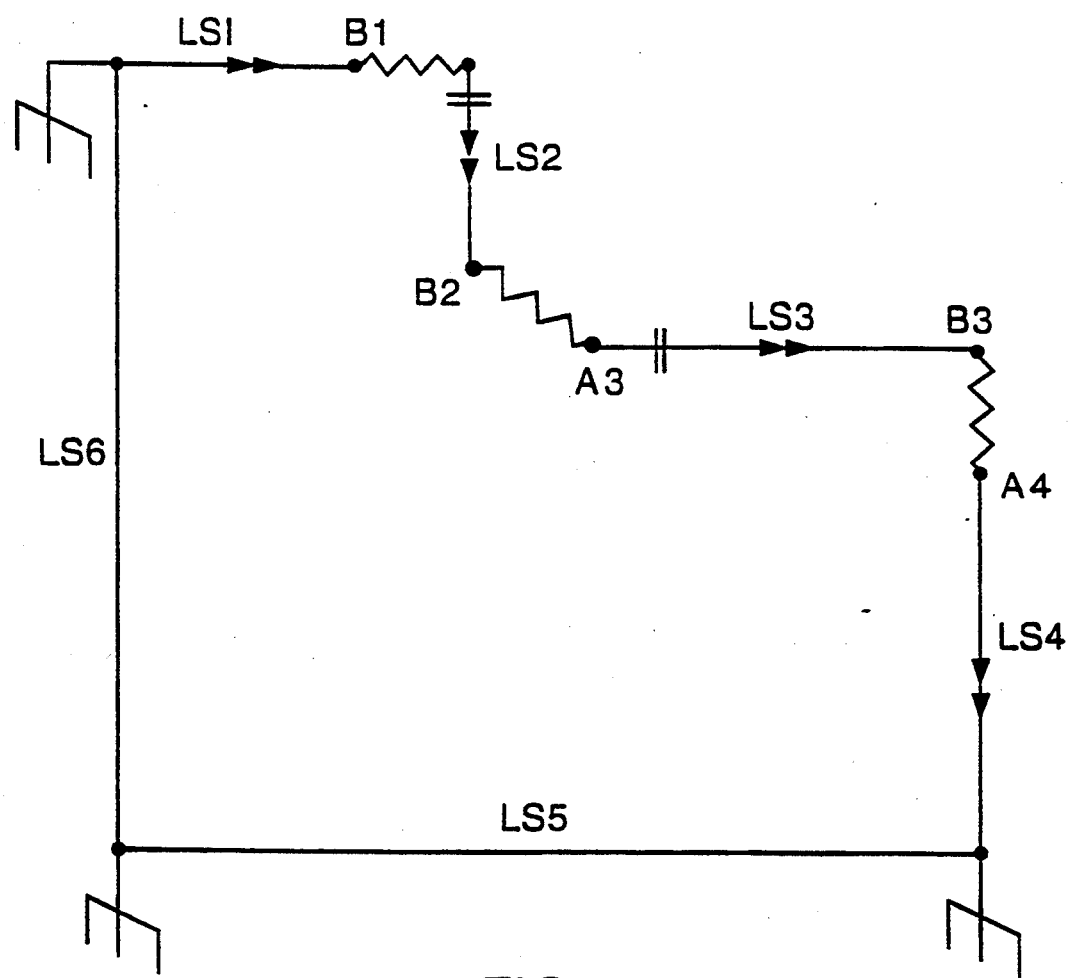
FIG. 5 illustrates an example of a topological constraint system, involving six line segments in 2-space, which has been partially solved.
Figure 5A:
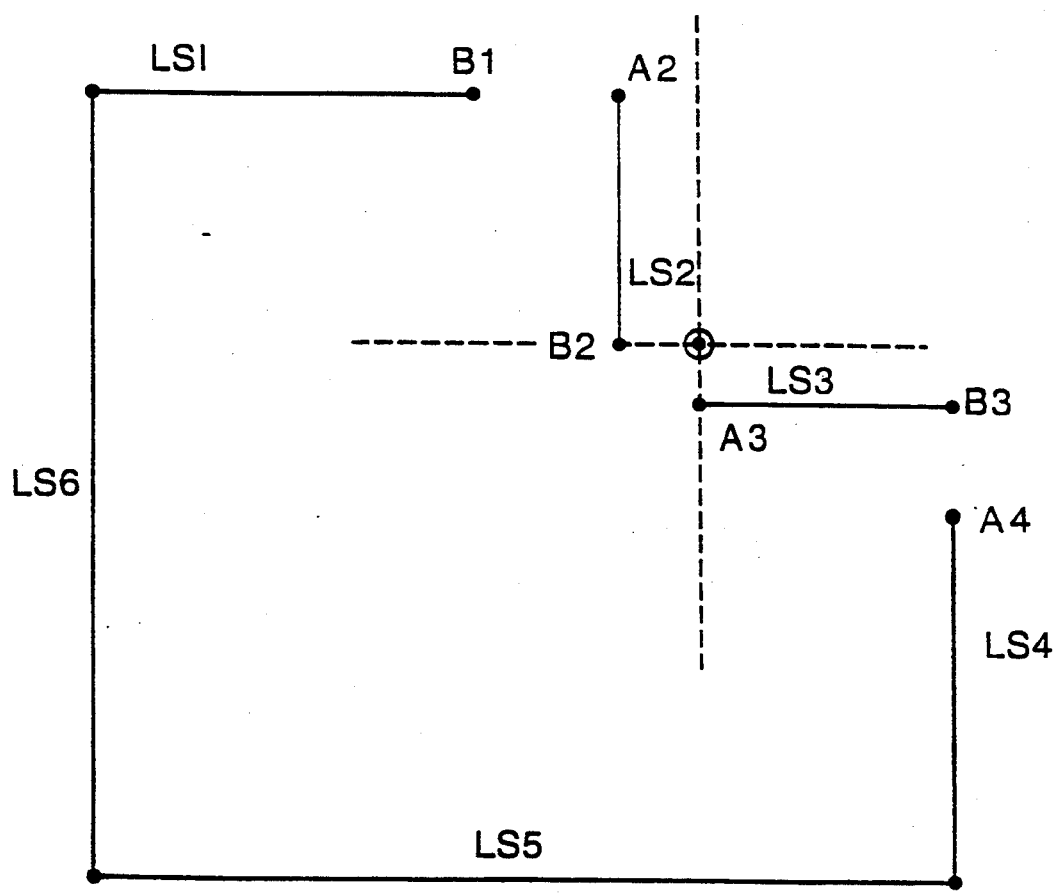
FIG. 5a schematically depicts solution of a constraint in FIG. 5.

Although some topological constraint systems can be solved by action solvers alone, other topological constraint systems can be solved only with the use of additional types of constraint solvers. An example utilizing such techniques is shown in FIGS. 5 and 5A, as follows:

The geometric elements in the example are six line segments —LS1, LS2, LS3, LS4, LS5 and LS6—in 2-space. With these geometric elements, a topological constraint system is formed by point-point coincidence constraints, horizontal and vertical direction constraints, and horizontal and vertical dimension constraints. As illustrated in FIG. 5, all direction constraints have previously been solved. Line segments LS5 and LS6 have been grounded, endpoints of line segments LS1 and LS4 have been attached to them, and lengths of line segments LS2 and LS3 have been fixed.

The remaining unsolved constraints are to make point B1 of line segment LS1 coincide with point A2 of line segment LS2, to make point B2 of line segment LS2 coincide with point A3 of line segment LS3, and to make point B3 of line segment LS3 coincide with point A4 of line segment LS4. These cannot be solved by action solvers, because no point is fixed enough to serve as a reference. A locus intersection solver is also ineligible to act, because no pair of points to be made coincident have both been constrained to lie on loci.

Solution strategy recognizes that the coincidence constraints B1-A2 and B3-A4 are each eligible to be solved by a second-order locus propagation solver, because B1 and A4 are both endpoints of fixed length, fixed direction line segments to be made coincident with points that are constrained to one-dimensional loci. Displaced loci are attached as invariants to endpoints B2 and A3, as shown in FIG. 5A, reducing the degrees of freedom for each of line segments LS2 and LS3 from two to one.

Solution strategy then recognizes that the coincidence constraint B2-A3 is eligible to be solved by a locus intersection solver, because both points have locus invariants. The locus intersection solver chooses an intersection of the loci, moves line segment endpoints B2 and A3 to it, and grounds line segments LS2 and LS3, reducing the degrees of freedom for each from one to zero.

Solution strategy next recognizes that coincidence constraints B1-A2 and B3-A4 are each eligible to be solved by action solvers. Action solvers solve these constraints, completing the solution of the topological constraint system. This illustrates how multiple types of constraint solvers, including higher-order constraint solvers, may be invoked in combination with action solvers.

When using degrees of freedom analysis to solve topological constraint systems for construction geometry, solution strategy may comprise a hierarchy of methods. It must apply action solvers and will preferably have access to a complete set of action solvers for all constraints, all geometric elements, all degrees of freedom and, when being used, all signatures. It is desirable that locus intersection solvers and higher-order constraint solvers be provided to solve constraints or combinations of constraints that cannot be solved by action solvers alone.

It is also desirable that solution strategy preferentially use action solvers, resorting to other types of constraint solvers only when no additional constraints can be solved by action solvers. Because action solvers are characterized by the types of constraints and by the types of geometric elements, their degrees of freedom and, when in use, their signatures, action solvers can be invoked without searching.

Figure 6:
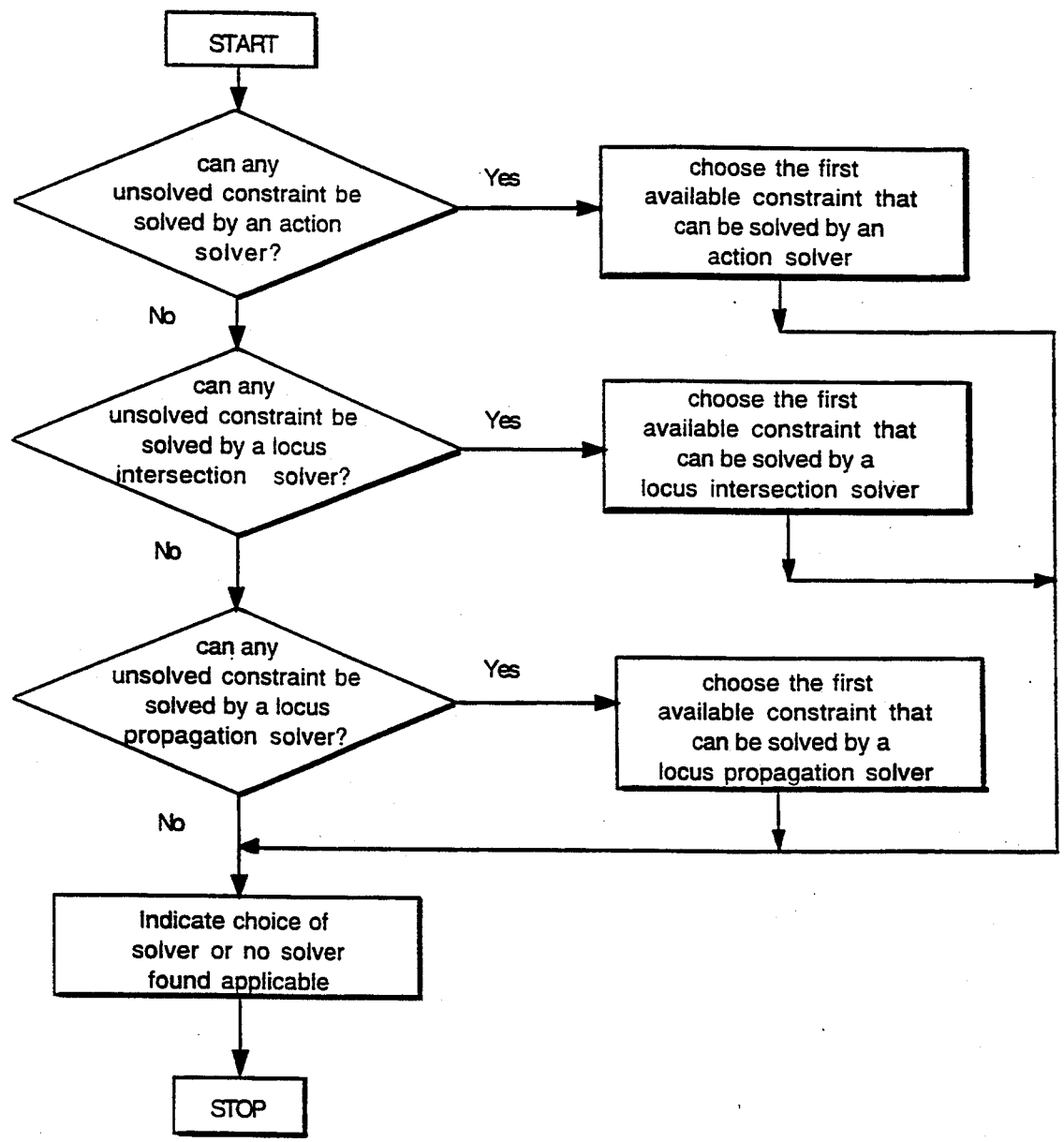
FIG. 6 schematically depicts a preferred solution strategy using a flow chart.

FIG. 6 schematically depicts a preferred solution strategy involving a hierarchy of action, locus intersection and locus propagation solvers, shown in a flow chart. This strategy preferentially seeks to apply an action solver. Action solvers are applied until no constraints remain that can be satisfied by them. Then the solution strategy tries to apply a locus intersection solver. If a locus intersection solver can be applied, the solution strategy will subsequently check again for applicability of an action solver. Locus intersection and action solvers are applied until no constraints remain that can be satisfied by them. Then the solution strategy tries to apply a locus propagation solver. If a locus propagation solver can be used, the solution strategy will subsequently check again for applicability of an action or locus intersection solver. When no constraint remains that can be satisfied by any of these constraint solvers, the solution strategy produces such an indication, which will cause solution synthesis to terminate.

Solution strategy may include a preference ranking for selecting types of geometric constraints to be solved, when the characteristics of the geometric elements and geometric constraints for which it was designed make such an approach useful. When geometric constraints are applied that confine geometric elements to a subspace of a geometric space in which the geometric elements are embedded, it may be desirable to apply subspace-confining constraints before applying other constraints, in order to simplify the algorithms of constraint solvers that apply other geometric constraints. When solving systems that include elements that are both rotatable and translatable, it may be more efficient to solve geometric constraints that affect rotations before solving those that affect only translations. In some circumstances, it may also be desirable for solution strategy to accept priority specifications for geometric constraints, influencing the order in which geometric constraints are selected to be solved, in order to seek a specially preferred solution.

At each step of solution synthesis, unsolved geometric constraints are examined to find one which is eligible to be solved by an available constraint solver. When computation is dominated by solution strategy algorithms, this leads to complexity of order n squared, where n is the number of geometric constraints. It is desirable to partition unsolved geometric constraints into lists according to requirements for applying action solvers and to update these lists at each solution step. Such an approach eliminates or reduces searching for the next solution step after most steps and can reduce expected complexity to order n log n.

The ordering of steps in a solution plan recorded during solution synthesis can be used to identify dependency relationships in a topological constraint system. When constraints affect common geometric elements, constraints solved later can be identified as dependent on the solution of constraints solved earlier in the plan. Representation of the unordered geometric constraints of a topological constraint system as an ordered graph is not unique, because some selections of constraints by solution strategy are arbitrary. It is nevertheless desirable to construct such an ordered graph or another representation of constraint ordering. When overconstraints occur, the ordering information retained by such a graph or other representation can be used to identify chains of related geometric constraints that contribute to an unsolvable topological constraint system.

When a topological constraint system is overconstrained, it is desirable that constraint solvers bring it as near as possible to conformance with its geometric constraints. The configuration of such a system can help to indicate problems in defining the geometric constraints that lead to overconstraint. In addition, measurements of numerical differences between constraint parameters and nearest configurations to solutions can provide primary guidance for iterative solvers.

6 Rigid Bodies and Special Techniques

It may be desirable for solution strategy to examine whether positions and orientations of the geometric elements involved in geometric constraints that have been solved have become fixed with respect to other geometric elements, even though such elements are not grounded. Only such other geometric elements as are related to a particular geometric element by geometric constraints that have been previously solved need be examined. If positions and orientations of a geometric element involved in a geometric constraint that was previously solved have become fixed with respect to other geometric elements, then such geometric elements can be combined in a rigid body rigid body accretion.

Figure 7:
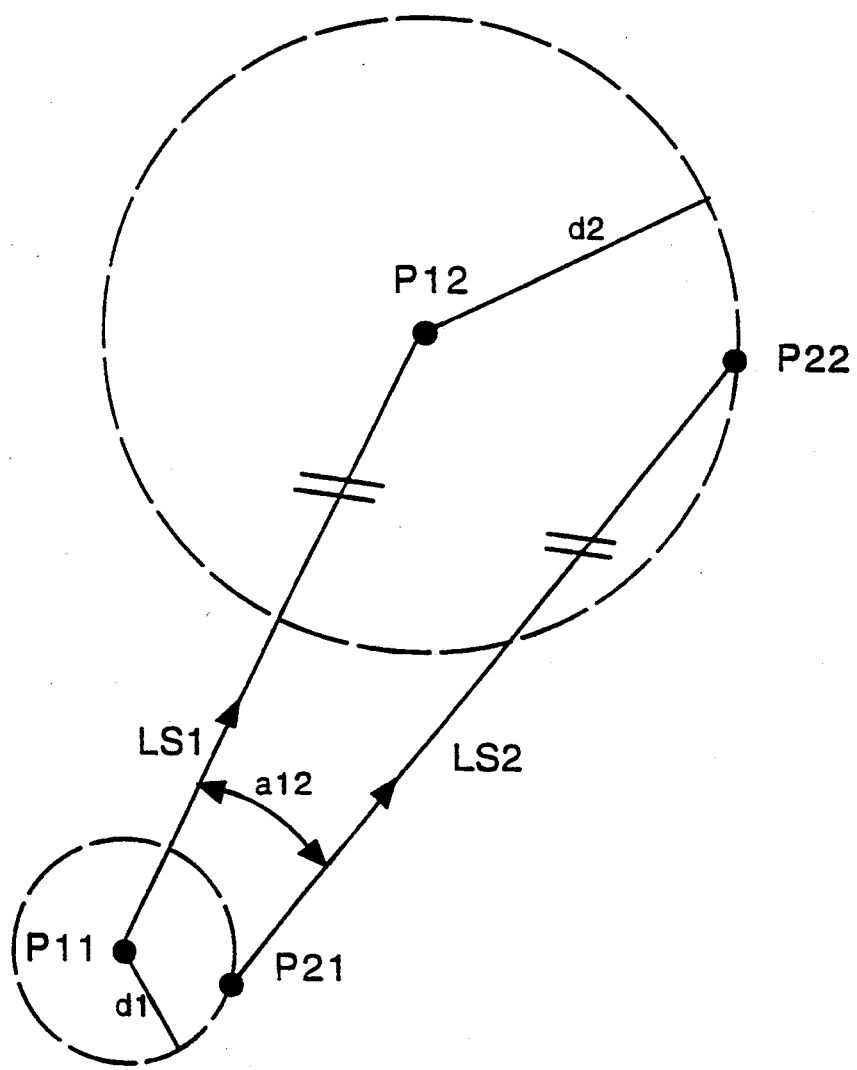
FIG. 7 schematically depicts a partially solved topological constraint system that will become eligible for rigid body accretion.

FIG. 7 illustrates a partially solved topological constraint system that will become eligible for rigid body accretion. In this topological constraint system, LS1 and LS2 are line segments in 2-space whose lengths have become grounded. Endpoint P21 of line segment LS2 is constrained to distance d1 from endpoint P11 of line segment LS1. Endpoint P22 of line segment LS2 is constrained to distance d2 from endpoint P12 of line segment LS1. The directions between LS1 and LS2 are constrained to relative angle a12. These constraints are sufficient, absent a singularity, to fix the position and orientation of LS1 and LS2 with respect to one another, even though neither is grounded. LS1 and LS2 can be combined into a rigid body.

For some topological constraint systems, such a procedure of rigid body accretion allows higher-order constraint solvers to become eligible for use. For example, a locus intersection solver might be ineligible for use without rigid body accretion. With rigid body accretion, it may be possible to use a locus propagation solver to determine a locus for a geometric element in a rigid body and then to use a locus intersection solver to determine a position for the geometric element, as well as for the other geometric elements that are also components of its rigid body.

Rigid body accretion may occur in one step or in a series of steps. For some topological constraint systems, it may be desirable for solution strategy, after each solution synthesis step, to examine the geometric elements involved in the geometric constraints that were solved for potential accretion in rigid bodies. For other topological constraint systems, it may be desirable for solution strategy to examine the geometric elements in the topological constraint system for potential rigid body accretion only when solution strategy finds that one or more of the available constraint solvers is ineligible for use. A choice between these approaches depends on the likelihood of encountering blockages in solving a topological constraint system that can be removed by accretion of rigid bodies.

It may be desirable to consider topological constraint systems equivalent to fully constrained even though their geometric constraints do not reduce their degrees of freedom to zero. Such situations commonly arise when solving constraints for subsystems in some topological constraint system that are later to become constrained to other subsystems. When such a subsystem can be combined into a single rigid body, it is a floating system, fully constrained except for lack of anchor constraints that would restrain it as an aggregate.

In such a situation, no plural constraint action solver may be initially eligible for use. Rather than apply computationally expensive solvers, it may be desirable for solution strategy to detect such situations and apply grounding solvers. Such constraint solvers will ground locations and directions so as to anchor a topological constraint system and provide geometric elements that are fixed enough to allow use of action solvers. However, it is possible to apply a grounding solver to an inappropriate choice of geometric element or property, causing a system that would have been reduced to a single rigid body to become overconstrained or spuriously constrained. Solution strategy may employ a hierarchy of preferences for types of geometric elements, types of geometric constraints, degrees of freedom states, and, when used, signatures, in selecting geometric constraints and properties of geometric elements for which to apply grounding solvers.

It may be desirable for solution strategy to invoke defaulting solvers when other types of constraint solvers become ineligible for use. However, it is possible to apply a defaulting solver to an inappropriate choice of geometric constraint, causing a system that would have been fully constrained to become overconstrained or spuriously constrained. Solution strategy may employ a hierarchy of preferences for types of geometric elements, types of geometric constraints, degrees of freedom states, and, when used, signatures, in selecting geometric constraints for which to apply defaulting solvers.

For example, when solving 2-space topological constraint system with line segments, it is sometimes preferable to assign default dimension values rather than to assign default position or orientation values. Defaulting solvers, like other constraint solvers, must preserve the requirements of geometric constraints that have been previously solved. They ground properties of geometric elements whose values they set; they ground the geometric elements to which these properties belong, when positions and orientations have become fixed; and they may cause accretion of geometric elements in rigid bodies.

A constraint solved by assigning a default value may prevent the solution of other constraints. It is desirable for constraints solved by defaulting solvers and descriptive parameters that have been assigned default values to be recorded in the solution plan generated by solution synthesis. However, while it might be possible to backtrack the solution process when this occurs and to change default values, it is usually difficult and may be impossible to determine, through closed-form algorithms, values that could have been assigned by defaulting solvers which would have prevented such problems.

A desirable alternative to backtracking in these circumstances is to use defaulted constraint parameters as the iteration variables for an iterative solver. Such a constraint solver may perform local iteration, solving only one geometric constraint or a set of related geometric constraints, or it may perform global iteration, solving an entire topological constraint system. The dependencies that can be identified from constraint ordering in a solution plan can be used to determine the other constraints affected by values of iteration variables and to identify portions of a topological constraint system that must be included in an iterative solution.

Measurements of numerical differences between constraint parameters and nearest configurations to solutions, when constraints cannot be exactly satisfied, provide primary guidance for iterative solvers in determining how to change the values of iteration variables during iteration and in determining the degree to which a solution has been approximated. It may also be desirable for constraint solvers to provide analytic derivatives expressing the dependence of such difference measurements on the values of iteration variables, in order to achieve more rapid or robust convergence of iterative solutions.

7 Advantages of Degrees of Freedom Analysis in Solving Topological Constraint Systems for Construction Geometry Degrees of freedom analysis, applied to solving topological constraint systems for construction geometry, combines advantages over other approaches to solving such topological constraint systems:

It works with a broad range of geometric elements and geometric constraints.

It recognizes topological properties and may provide for topological constraints.

It functions independently of the dimension of a geometric space and of other special characteristics of geometric elements or geometric constraints to which it may be applied.

It attains high performance and predictable performance by avoiding backtracking.

It identifies and solves topological constraint systems that are underconstrained, without loss of speed or accuracy.

It avoids moving geometric elements that do not need to be moved in order to produce solutions.

It identifies and partially solves topological constraint systems that are overconstrained or spuriously constrained, without loss of speed or accuracy.

In addition to solving a topological constraint system, it generates a compact, well-ordered algorithm -a solution plan -which can be executed again to find iterative solutions or additional solutions for changes in constraint parameters.

It produces a closed form algorithm to solve a topological constraint system, when one exists.

With optional but preferred enhancements, solution synthesis for topological constraint systems, using degrees of freedom analysis, has additional advantages over other approaches to solving topological constraint systems:

It can maintain the geometric significance of parameters and relationships in its algorithms and internal data representations.

It can identify action solvers needed to solve geometric constraints on the basis of only degrees of freedom and, if used, of signatures, without searching.

It can apply higher-order constraint solvers when action solvers cannot be applied.

It can preferentially utilize the highest performance algorithms, resorting to lower performance algorithms only when necessary.

It can identify singularities in constraints, recognize their geometric significance, and find correct solutions when they occur.

It can recognize the geometric significance of biases and can use biases to satisfy topological requirements.

It can measure and maintain biases, preserving the topology of an initial configuration of geometry while bringing quantitative properties of geometry into conformance with geometric constraints.

It can provide regions of shape preservation and shape distortion, through selective maintenance of biases.

It can identify and accept passive constraints.

It can provide solutions that involve the least adjustment of geometric elements.

It can solve constraints in an order influenced by priorities that increase computational efficiency or meet special requirements.

It can achieve solution synthesis performance scaled as n log n, where n is the number of geometric constraints.

It can identify related constraints that cause an overconstrained topological constraint system to be unsolvable.

It can present a geometric configuration that is as close as possible to the requirements of an overconstrained topological constraint system.

It can complete the solution of underconstrained topological constraint systems and identify topological constraint systems requiring iterative solutions by using defaulting solvers.

It can apply iterative constraint solvers to solve or complete the solution of topological constraint system for which it cannot find closed form solution algorithms.

It can use dependencies identified through the ordering of solution steps to restrict iterative solutions to the portions of topological constraint systems not solved by closed form algorithms.

It is claimed:

1. A computer-implemented method for producing a computer-aided design of mechanical parts in a physical assembly comprising the steps of:
   a) providing a topological constraint system comprising a set of geometric elements corresponding to physical shapes of said mechanical parts, said topological constraint system serving as a template for mating said physical shapes of said mechanical parts in said assembly, said constraint system specifying a set of geometric constraints and topological properties for said geometric elements,
   b) categorizing states of said geometric elements according to degrees of freedom of said geometric elements;
   c) categorizing topological properties of said topological constraint system in terms of biases;
   d) satisfying geometric constraints and reducing degrees of freedom of the geometric elements of the system using the substeps of:
      i) identifying a geometric constraint that can be satisfied by manipulating one or more of said geometric elements with a computer-implemented constraint solver,
      ii) implementing by computer said constraint solver, said solver utilizing the geometric element categories and topological properties categories to manipulate said one or more geometric elements into a configuration that satisfies the identified constraint,
      iii) recording a result of the implementing substep (ii), including a new state of said one or more geometric elements, new values of their respective descriptive parameters, and an identification of the constraint solver implemented; and
   e) repeating step (d) for a plurality of geometric constraints to produce a configuration of said geometric elements satisfying the constraints in the topological constraint system that can be satisfied by a solver, said configuration corresponding to a design for arranging said corresponding physical shapes of said mechanical parts in said assembly.

2. The method of claim 1, said categorizing step (b) including the substep of creating subcategories of said geometric elements based on invariants and signatures of said geometric elements, where an invariant describes an expression of the degrees of freedom for a geometric element and a signature identifies the combination of invariants for a subcategory.

3. The method of claim 1, said satisfying step (d) including a solution strategy step comprising the substeps of selecting a constraint to be satisfied by a solver, and implementing said solver to produce a configuration of said geometric elements satisfying said constraint.

4. The method of claim 1, said recording substep (d) (iii) including the step of recording invariants and signatures for said geometric elements, wherein an invariant is an expression of degrees of freedom for a geometric element and a signature describes a combination of invariants expressing the degrees of freedom of a geometric element.

5. The method of claim 1, at least some of said constraints being nondirectional, said satisfying step (d) including the step of providing a constraint solver for satisfying plural constraints independently of the geometric element governed by the constraints.

6. The method of claim 1, said satisfying step (d) including the substep of identifying said constraint solver using said categorized degrees of freedom states.

7. The method of claim 1, including the step of specifying a bias for said topological properties in said system, said solver manipulating said one or more geometric elements to satisfy said bias.

8. The method of claim 7, said specifying step including the step of measuring a bias of a geometric element with respect to a configuration of geometric elements in the system.

9. The method of claim 7, wherein said specifying step comprises the step of preferentially maintaining a bias exhibited by a configuration of the geometric elements prior to implementing said solver.

10. The method of claim 1, said constraint being chosen from a group including: action solvers, higher order constraint solvers, locus intersection solvers, and locus propagation solvers.

11. The method of claim 1, including the steps of partitioning unsolved constraints into lists according to requirements for applying constraint solvers and updating the lists after the implementing substep (d) (ii).

12. The method of claim 1, including the step of identifying dependency relationships of geometric constraints utilizing the identification of the constraint solver implemented in said satisfying step (d) to identify a first constraint that is solved by said constraint solver, said first constraint being dependent on a second constraint that was solved earlier than said first constraint.

13. The method of claim 12, including the steps of determining if said system is overconstrained and finding a chain of related geometric constraints based on said dependency relationships that contributes to said system being overconstrained.

14. The method of claim 1, including the step of detecting when said system is a floating system, and further in said satisfying step (d), including the step of invoking a grounding constraint solver which provides anchor constraints to one or more geometric elements.

15. The method of claim 1, said satisfying step (d) including the step of implementing a defaulting solver.

16. The method of claim 1, said satisfying step (d) including the step of implementing an iterative solver.

17. The method of claim 1 wherein said categorizing step (c) includes the step of applying a solution strategy to identify said constraint, said solution strategy preferentially identifying a constraint governing a fewest number of movable elements in said system.

18. A system for producing a computer-aided design of mechanical parts in an assembly, comprising:
    means for providing a topological constraint system comprising a set of geometric elements corresponding to physical shapes of said mechanical parts, said topological constraint system serving as a template for mating said physical shapes of said mechanical parts in said assembly, said constraint system specifying a set of geometric constraints and topological properties for said geometric elements,
    means for categorizing states of said geometric elements according to degrees of freedom of said geometric elements;
    means for categorizing topological properties of said topological constraint system in terms of biases;
    means for satisfying geometric constraints and reducing degrees of freedom of the geometric elements of the system, comprising
        i) means for identifying a geometric constraint that can be satisfied by manipulating one or more of said geometric elements with a computer-implemented constraint solver,
        ii) means for implementing by computer said constraint solver, said solver utilizing the geometric element categories and topological properties categories to manipulate said one or more geometric elements into a configuration that satisfies the identified constraint,
        iii) means for recording a result of the implementation of the constraint solver, including a new state of said one or more geometric elements, new values of their respective descriptive parameters, and an identification of the constraint solver implemented; and
    means for repeatedly invoking the means for satisfying a geometric constraint for a plurality of geometric constraints, said means for repeatedly invoking producing a configuration of said geometric elements satisfying the constraints of said topological constraint system that can be satisfied by a solver, said configuration corresponding to a design for arranging said corresponding physical shapes of said mechanical parts in said assembly.

19. The apparatus of claim 18, said means for categorizing said geometric elements comprising means for creating subcategories of said geometric elements based on invariants and signatures of said geometric elements, wherein an invariant is an expression of the degrees of freedom for a geometric element and a signature identifies the combination of invariants for a subcategory.

20. The apparatus of claim 18, said means for satisfying comprising means for implementing a solution strategy for selecting a constraint that can be solved by a constraint solver, and implementing said constraint solver to produce a configuration of geometric elements satisfying said constraint.

21. The apparatus of claim 18, said means for recording comprising means for recording invariants and signatures for said geometric elements, wherein an invariant is an expression of degrees of freedom for a geometric element and a signature describes a combination of invariants expressing the degrees of freedom of a geometric element.

22. The apparatus of claim 18 wherein at least some of said constraints are nondirectional, said means for satisfying comprising means for providing a constraint solver for satisfying plural constraints independently of the geometric element governed by the constraints.

23. The apparatus of claim 18 wherein said means for satisfying comprise means for identifying said constraint solver using said categorized degrees of freedom states.

24. The apparatus of claim 18 further comprising means for specifying a bias for said topological properties in said system, said solver manipulating said one or more geometric elements to satisfy said bias.

25. The apparatus of claim 24 wherein said means for specifying comprises means for measuring a bias of a geometric element with respect to a configuration of geometric elements in the system.

26. The apparatus of claim 24 wherein said means for specifying comprises means for maintaining a bias exhibited by a configuration of the geometric elements prior to implementing said solver.

27. The apparatus of claim 18 wherein said means for satisfying comprises means for choosing said constraint solver from a group including: action solvers, higher order constraint solvers, locus intersection solvers, and locus propagation solvers.

28. The apparatus of claim 18 further comprising means for partitioning unsolved constraints into lists according to requirements for applying constraint solvers and means for updating the lists after implementing said constraint solver.

29. The apparatus of claim 18 further comprising means for identifying dependency relationships of constraints using the identification of the constraint solver to identify a first constraint that is solved by said constraint solver, said first constraint being dependent on a second constraint that was solved earlier than said first constraint.

30. The apparatus of claim 29 further comprising means for determining if said system is overconstrained and means for finding a chain of related geometric constraints based on said dependency relationships that contributes to said system being overconstrained.

31. The apparatus of claim 18 further comprising means for detecting when said system is a floating system, said means for implementing comprising means for implementing a grounding constraint which provides anchor constraints to one or more geometric elements.

32. The apparatus of claim 18 wherein said means for satisfying comprises means for implementing a defaulting solver.

33. The apparatus of claim 18 wherein said means for satisfying comprises means for implementing an iterative solver.

34. The apparatus of claim 18 wherein said means for satisfying comprises means for applying a solution strategy to identify said constraint, said solution strategy preferentially identifying a constraint governing a fewest number of movable elements in said system.

* * * * *